(12) United States Patent
Chung et al.

(10) Patent No.: US 11,785,818 B2
(45) Date of Patent: Oct. 10, 2023

(54) ORGANIC LIGHT EMITTING DISPLAY APPARATUS

(71) Applicant: SAMSUNG DISPLAY CO., LTD., Yongin-Si (KR)

(72) Inventors: Yun-mo Chung, Yongin-si (KR); Tak-young Lee, Anyang-si (KR); Joosun Yoon, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/182,799

(22) Filed: Feb. 23, 2021

(65) Prior Publication Data

US 2021/0175321 A1 Jun. 10, 2021

Related U.S. Application Data

(63) Continuation of application No. 16/409,456, filed on May 10, 2019, now Pat. No. 10,937,854.

(30) Foreign Application Priority Data

May 10, 2018 (KR) ........................ 10-2018-0053725

(51) Int. Cl.
*H01L 27/32* (2006.01)
*H10K 59/131* (2023.01)
(Continued)

(52) U.S. Cl.
CPC ....... *H10K 59/1315* (2023.02); *G09G 3/3233* (2013.01); *G09G 3/3266* (2013.01);
(Continued)

(58) Field of Classification Search
CPC combination set(s) only.
See application file for complete search history.

(56) References Cited

U.S. PATENT DOCUMENTS 7,528,544 B2 5/2009 Kwak et al.
8,350,466 B2 1/2013 Murakami et al.
(Continued)

FOREIGN PATENT DOCUMENTS

EP 1 503 422 A2 2/2005
JP 2012-155987 A 8/2012
(Continued)

OTHER PUBLICATIONS

Extended European Patent Office Search Report for corresponding European Patent Application No. 19173706.3, dated Oct. 14, 2019, 10 pages.

*Primary Examiner* — Van N Chow
(74) *Attorney, Agent, or Firm* — Lewis Roca Rothgerber Christie LLP

(57) ABSTRACT

An organic light emitting display apparatus includes a base layer, a circuit element layer, a display element layer, an encapsulation layer, and a sealing member. The circuit element layer includes a power supply line on the base layer and an auxiliary power supply pattern on and connected to the power supply line. The display element layer includes a first electrode, a light emitting layer, and a second electrode, which are sequentially stacked on the circuit element layer. The second electrode is electrically connected to the auxiliary power supply pattern. The sealing member is between the circuit element layer and the encapsulation layer to overlap with the auxiliary power supply pattern when viewed in a plan view.

18 Claims, 10 Drawing Sheets

(51) Int. Cl.
    *G09G 3/3233*      (2016.01)
    *G09G 3/3266*      (2016.01)
    *H01L 27/02*      (2006.01)
    *H10K 50/842*      (2023.01)
    *H10K 59/40*      (2023.01)
    *H10K 59/122*      (2023.01)
    *H10K 59/124*      (2023.01)
    *H10K 59/121*      (2023.01)

(52) U.S. Cl.
    CPC ..... *H01L 27/0296* (2013.01); *H10K 50/8426* (2023.02); *H10K 59/122* (2023.02); *H10K 59/124* (2023.02); *H10K 59/1213* (2023.02); *H10K 59/40* (2023.02)

(56) References Cited

U.S. PATENT DOCUMENTS

| | | |
|---|---|---|
| 9,178,002 B2 | 11/2015 | Hong |
| 9,362,531 B2 | 6/2016 | Hong |
| 9,449,553 B2 | 9/2016 | Kwak et al. |
| 9,502,683 B2 | 11/2016 | Hong et al. |
| 9,633,871 B2 | 4/2017 | Hatano et al. |
| 10,446,636 B2 | 10/2019 | Lee et al. |
| 10,540,029 B2 | 1/2020 | Shim et al. |
| 10,777,628 B2 | 9/2020 | Kim et al. |
| 2006/0267885 A1 | 11/2006 | Kwak et al. |
| 2013/0049003 A1 | 2/2013 | Choi et al. |
| 2013/0049062 A1 | 2/2013 | Hatano et al. |
| 2013/0293236 A1 | 11/2013 | Lee et al. |
| 2015/0102299 A1 | 4/2015 | Hong |
| 2015/0379923 A1 | 12/2015 | Lee et al. |
| 2016/0035284 A1 | 2/2016 | Jung et al. |
| 2016/0086977 A1 | 3/2016 | Go et al. |
| 2016/0293688 A1 | 10/2016 | Chen et al. |
| 2016/0293883 A1 | 10/2016 | Hong et al. |
| 2019/0067218 A1 | 2/2019 | Lin et al. |
| 2021/0226173 A1 | 7/2021 | Koshihara |

FOREIGN PATENT DOCUMENTS

| | | |
|---|---|---|
| JP | 2013-45629 A | 3/2013 |
| KR | 10-2005-0013874 A | 2/2005 |
| KR | 10-2006-0117119 A | 11/2006 |
| KR | 10-2013-0023099 A | 3/2013 |
| KR | 10-1266023 | 5/2013 |
| KR | 10-2015-0043136 | 4/2015 |
| KR | 10-2015-0043648 A | 4/2015 |
| KR | 10-2015-0114010 | 10/2015 |
| KR | 10-2016-0000553 A | 1/2016 |
| KR | 10-2016-0017695 A | 2/2016 |
| KR | 10-2016-0119376 A | 10/2016 |
| KR | 10-2018-0004382 | 1/2018 |
| KR | 10-2018-0042504 | 4/2018 |
| KR | 10-2018-0044491 | 5/2018 |

ORGANIC LIGHT EMITTING DISPLAY APPARATUS

CROSS-REFERENCE TO RELATED APPLICATIONS

This application is a continuation of U.S. patent application Ser. No. 16/409,456, filed on May 10, 2019, which claims priority to and the benefit of Korean Patent Application No. 10-2018-0053725, filed on May 10, 2018, the contents of each of which are hereby incorporated by reference in their entirety.

BACKGROUND

1. Field

Aspects of embodiments of the present disclosure relate to an organic light emitting display apparatus.

2. Description of the Related Art

In recent years, an organic light emitting display apparatus has been employed in various display apparatuses since it has advantages, such as wide viewing angle, superior contrast, and fast response speed.

The organic light emitting display apparatus includes an organic light emitting diode to emit a light, and the organic light emitting diode is vulnerable to moisture and oxygen. For the organic light emitting diode, a sealing member is disposed on an exterior of the organic light emitting display apparatus to seal the organic light emitting diode.

The sealing member may be formed by placing a curable material between a lower substrate and an upper substrate and curing the curable material; however, a defect may occur in circuit elements around the sealing member during the curing process.

SUMMARY

According to an aspect of embodiments of the present disclosure, an organic light emitting display apparatus is capable of reducing a non-display area of a display panel.

According to another aspect of embodiments of the present disclosure, an organic light emitting display apparatus is capable of preventing or substantially preventing circuit elements overlapped with a sealing member from becoming defective during a curing process for the sealing member.

According to one or more embodiments of the inventive concept, an organic light emitting display apparatus includes a base layer, a circuit element layer, a display element layer, an encapsulation layer, and a sealing member.

In one or more embodiments, the base layer includes a display area and a non-display area adjacent to the display area.

In one or more embodiments, the circuit element layer includes a power supply line and an auxiliary power supply pattern. The power supply line is on the base layer to receive a common voltage. The auxiliary power supply pattern is on the power supply line, overlapped with the power supply line, and connected to the power supply line.

In one or more embodiments, the display element layer includes a first electrode, a light emitting layer, and a second electrode. The first electrode is on the circuit element layer. The light emitting layer is on the first electrode. The second electrode is on the light emitting layer and electrically connected to the auxiliary power supply pattern.

In one or more embodiments, the encapsulation layer is on the display element layer.

In one or more embodiments, the sealing member is between the circuit element layer and the encapsulation layer and disposed in the non-display area to overlap with the auxiliary power supply pattern when viewed in a plan view.

In one or more embodiments, the auxiliary power supply pattern contacts the sealing member.

In one or more embodiments, the display element layer further includes an auxiliary pattern in the non-display area, located on a same layer as the first electrode, and connected to the auxiliary power supply pattern.

In one or more embodiments, the circuit element layer further includes a first intermediate insulating layer and a second intermediate insulating layer. The first intermediate insulating layer is between the power supply line and the auxiliary power supply pattern and includes a contact hole through which the power supply line is connected to the auxiliary power supply pattern. The second intermediate insulating layer is between the auxiliary power supply pattern and the auxiliary pattern and includes a contact hole through which the auxiliary power supply pattern is connected to the auxiliary pattern.

In one or more embodiments, the display element layer further includes a pixel definition layer between the auxiliary pattern and the second electrode, the pixel definition layer including a contact hole through which the auxiliary pattern is connected to the second electrode, and an opening in which the light emitting layer is located.

In one or more embodiments, the circuit element layer further includes a switching transistor, a driving transistor, and a light emitting control transistor.

In one or more embodiments, the switching transistor includes a control electrode to receive a scan signal, an input electrode to receive a data signal, and an output electrode.

In one or more embodiments, the driving transistor includes an input electrode connected to the output electrode of the switching transistor.

In one or more embodiments, the light emitting control transistor includes a control electrode to receive a light emitting signal and is connected between a voltage line and the driving transistor or between the driving transistor and the first electrode.

In one or more embodiments, the circuit element layer further includes a light emitting line driving circuit and a gate driving circuit. The light emitting line driving circuit applies the light emitting signal to the light emitting control transistor. The gate driving circuit applies the scan signal to the switching transistor. The light emitting line driving circuit is farther from the display area than the gate driving circuit when viewed in a plan view.

In one or more embodiments, the auxiliary power supply pattern overlaps with the light emitting line driving circuit.

In one or more embodiments, the auxiliary power supply pattern includes a material having a melting point higher than a melting point of the power supply line.

In one or more embodiments, the circuit element layer further includes a voltage line receiving a source voltage greater than the common voltage and an auxiliary voltage pattern above the voltage line and connected to the voltage line.

In one or more embodiments, the auxiliary voltage pattern is on a same layer as the auxiliary power supply pattern and overlaps with the sealing member.

In one or more embodiments, the auxiliary voltage pattern contacts the sealing member.

In one or more embodiments, the circuit element layer further includes a pad part in the non-display area. The auxiliary voltage pattern is between the pad part and the display area when viewed in a plan view.

In one or more embodiments, the circuit element layer further includes a data line and a demultiplexer. The demultiplexer is connected between the pad part and the data line. The auxiliary voltage pattern covers the demultiplexer when viewed in a plan view.

In one or more embodiments, the circuit element layer further includes an anti-static pattern in the non-display area. The auxiliary voltage pattern covers the anti-static pattern when viewed in a plan view.

In one or more embodiments, the circuit element layer further includes an insulating layer under the auxiliary power supply pattern. The auxiliary power supply pattern comprises a hole defined therethrough, and the sealing member contacts the insulating layer or the base layer through the hole.

According to one or more embodiments of the inventive concept, an organic light emitting display apparatus includes a base layer, a power supply line, a voltage supply line, an auxiliary power supply pattern, an auxiliary voltage pattern, an organic light emitting diode, an encapsulation layer, and a sealing member.

In one or more embodiments, the power supply line is on the base layer to receive a common voltage.

In one or more embodiments, the voltage supply line is on the base layer to receive source voltage greater than the common voltage.

In one or more embodiments, the auxiliary power supply pattern is on the power supply line, overlapped with the power supply line, and connected to the power supply line.

In one or more embodiments, the auxiliary voltage pattern is above the voltage supply line, overlapped with the voltage supply line, and connected to the voltage supply line.

In one or more embodiments, the organic light emitting diode is above the auxiliary power supply pattern and the auxiliary voltage pattern.

In one or more embodiments, the encapsulation layer is on the organic light emitting diode.

In one or more embodiments, the sealing member is between the base layer and the encapsulation layer to seal the organic light emitting diode and overlapped with the auxiliary power supply pattern and the auxiliary voltage pattern.

In one or more embodiments, the auxiliary power supply pattern is on a same layer as the auxiliary voltage pattern.

In one or more embodiments, each of the auxiliary power supply pattern and the auxiliary voltage pattern includes a material having a melting point higher than a melting point of each of the power supply line and the voltage supply line.

In one or more embodiments, each of the auxiliary power supply pattern and the auxiliary voltage pattern contacts the sealing member.

According to one or more embodiments of the inventive concept, an organic light emitting display apparatus includes a base layer, a transistor, an organic light emitting diode, a power supply line, an auxiliary power supply pattern, an encapsulation layer, and a sealing member.

In one or more embodiments, the transistor is on the base layer and includes a control electrode, an input electrode, and an output electrode.

In one or more embodiments, the organic light emitting diode is above the transistor and connected to the transistor.

In one or more embodiments, the power supply line is on the base layer to receive a constant voltage, and is on a same layer as one of the control electrode, the input electrode, and the output electrode of the transistor.

In one or more embodiments, the auxiliary power supply pattern is above the power supply line and the transistor, under the organic light emitting diode, and connected to the power supply line.

In one or more embodiments, the encapsulation layer is on the organic light emitting diode.

In one or more embodiments, the sealing member is between the base layer and the encapsulation layer to seal the organic light emitting diode and overlapped with the auxiliary power supply pattern and the auxiliary voltage pattern.

According to an aspect of embodiments of the present disclosure, the non-display area of the display panel may be reduced.

In addition, circuit elements overlapped with the sealing member may be prevented or substantially prevented from becoming defective when the sealing member is cured.

BRIEF DESCRIPTION OF THE DRAWINGS

The above and other aspects of the present disclosure will become readily apparent by reference to the following detailed description when considered in conjunction with the accompanying drawings, wherein.

DETAILED DESCRIPTION

Figure 1:
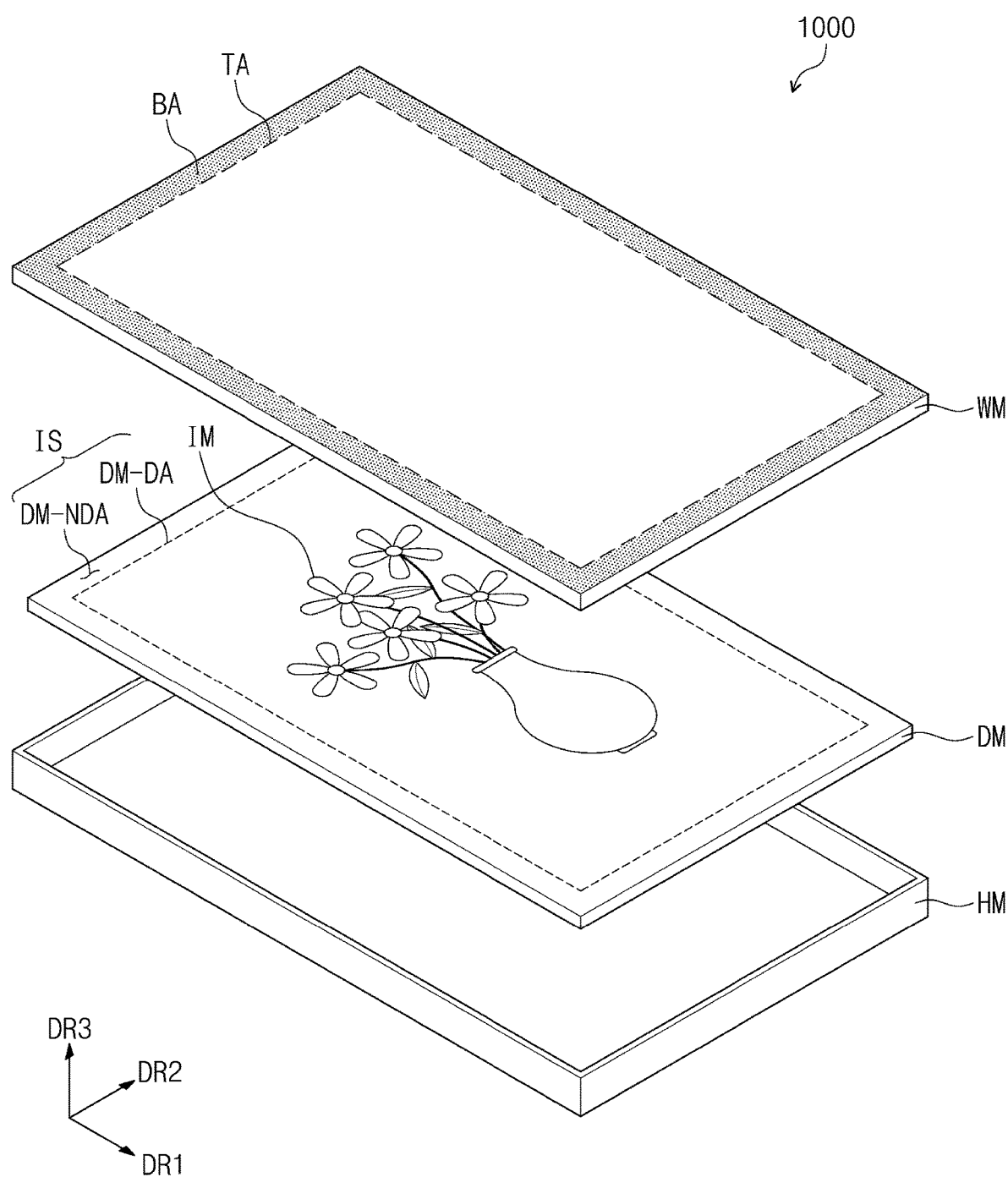
FIG. 1 is a perspective view showing a display apparatus according to an exemplary embodiment of the present disclosure.

Herein, some example embodiments of the present invention will be explained in further detail with reference to the accompanying drawings. In the following description, it is to be understood that when an element, such as a region, layer, or portion, is referred to as being "on," "connected to," or "coupled to" another element or layer, it may be directly on, connected, or coupled to the other element or layer or one or more intervening elements or layers may be present.

Like numerals refer to like elements throughout. In the drawings, the thicknesses and sizes of elements may be exaggerated for clarity. As used herein, the term "and/or" includes any and all combinations of one or more of the associated listed items.

The use of the terms "first," "second," etc. does not denote any order or importance, but, rather, the terms "first," "second," etc. are used to distinguish one element from another. Thus, a first element, component, region, layer, or section discussed below could be termed a second element, component, region, layer, or section without departing from the teachings of the present disclosure. It is to be understood that the singular forms "a," "an," and "the" include plural referents unless the context clearly dictates otherwise.

Spatially relative terms, such as "beneath," "below," "lower," "above," "upper," and the like, may be used herein for ease of description to describe one element or feature's relationship to another element(s) or feature(s) as illustrated in the figures.

It is to be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
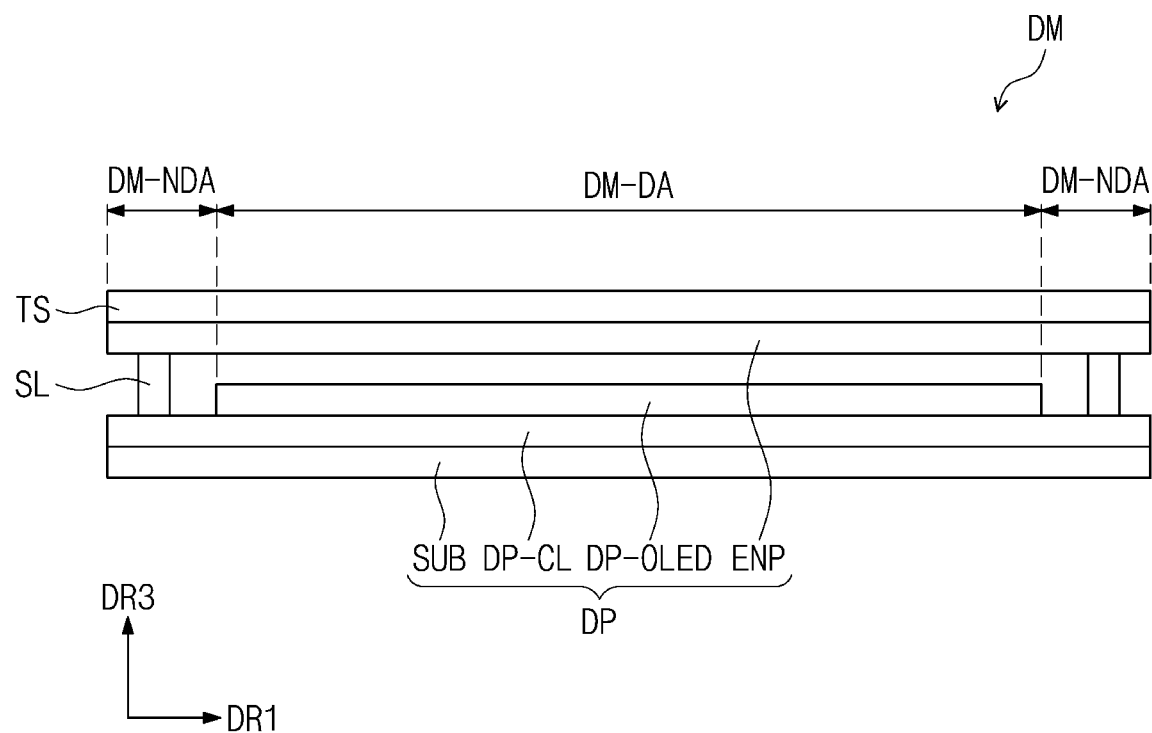
FIG. 2 is a cross-sectional view showing a display module of FIG. 1.

FIG. 1 is a perspective view showing a display apparatus 1000 according to an exemplary embodiment of the present disclosure; and FIG. 2 is a cross-sectional view showing a display module DM of FIG. 1.

The display apparatus 1000 may be applied to a large-sized electronic device, such as a television set and a monitor, and a small and medium-sized electronic device, such as a mobile phone, a tablet computer, a car navigation unit, a game unit, and a smart watch, for example.

Referring to FIG. 1, the display apparatus 1000 according to an embodiment includes a display module DM, a window member WM, and a housing member HM.

A display surface IS, through which an image IM of the display module DM is displayed, is substantially parallel to a surface defined by a first direction axis DR1 and a second direction axis DR2. A third direction axis DR3 indicates a normal line direction of the display surface IS, i.e., a thickness direction of the display module DM. Front (or upper) and rear (or lower) surfaces of each member are distinguished from each other by the third direction axis DR3. However, directions indicated by the first, second, and third direction axes DR1, DR2, and DR3 are relative to each other, and, thus, the directions indicated by the first, second, and third direction axes DR1, DR2, and DR3 may be changed to other directions. Herein, first, second, and third directions, which are respectively indicated by the first, second, and third direction axes DR1, DR2, and DR3, will be assigned with the same reference numerals as those of the first, second, and third direction axes DR1, DR2, and DR3.

In an embodiment, the display module DM may be a flat and rigid display device; however, the display module DM is not limited to the flat and rigid display device. That is, the display module DM may be a flexible display module.

As shown in FIG. 1, the display module DM includes a display area DM-DA through which the image IM is displayed, and a non-display area DM-NDA disposed adjacent to the display area DM-DA. The image IM is not displayed through the non-display area DM-NDA. FIG. 1 shows a vase as a representative example of the image IM. As an example, the display area DM-DA may have a quadrangular shape, and the non-display area DM-NDA surrounds the display area DM-DA, but the present disclosure is not limited thereto or thereby. That is, the shape of the display area DM-DA and the shape of the non-display area DM-NDA may be designed or varied relative to each other.

The window member WM is disposed on the display module DM. The window member WM protects the display module DM. The window member WM is coupled to the housing member HM to define an internal space therebetween. The window member WM and the housing member HM define an exterior of the display apparatus 1000.

The window member WM is divided into a transmission area TA and a bezel area BA when viewed in a plan view. The transmission area TA transmits most of light incident thereto. The transmission area TA has an optical transparency. In an embodiment, the transmission area TA has a light transmittance of about 90% or more. The transmission area TA corresponds to the display area DM-DA of the display module DM.

The bezel area BA blocks most of light incident thereto. In an embodiment, the bezel area BA ensures or provides that components arranged under the window member WM are not visible from an outside of the window member WM. In addition, the bezel area BA reduces a reflection of the light incident thereto from the outside of the window member WM. The bezel area BA corresponds to the non-display area DM-NDA of the display module DM.

The bezel area BA is adjacent to the transmission area TA. A shape of the transmission area TA in a plan view is defined by the bezel area BA.

The housing member HM provides an internal space (e.g., a predetermined internal space). The display module DM is accommodated in the internal space. In addition to the display module DM, various electronic parts, e.g., a power supply, a storage device, a sound input/output module, and a camera, may be arranged in the internal space of the housing member HM.

FIG. 2 is a cross-sectional view showing the display module DM according to an exemplary embodiment of the present disclosure. FIG. 2 shows a cross-section defined by the first direction axis DR1 and the third direction axis DR3.

As shown in FIG. 2, in an embodiment, the display module DM includes a display panel DP and a touch sensing unit TS (or "touch sensing layer"). Although not shown separately, the display module DM according to an exemplary embodiment of the present disclosure may further include a protective member disposed on a lower surface of the display panel DP.

The display panel DP may be a light emitting type display panel, but is not particularly limited. For instance, the display panel DP may be an organic light emitting display panel or a quantum-dot light emitting display panel. A light emitting layer of the organic light emitting display panel includes an organic light emitting material. A light emitting layer of the quantum-dot light emitting display panel includes a quantum dot or a quantum rod. Herein, the organic light emitting display panel will be described as the display panel DP.

The display panel DP includes a base layer SUB, a circuit element layer DP-CL, a display element layer DP-OLED, and an encapsulation layer ENP. The circuit element layer DP-CL, the display element layer DP-OLED, and the encapsulation layer ENP are disposed on the base layer SUB.

Although not shown separately, the display panel DP may further include functional layers, such as a refractive index control layer.

In an embodiment, the base layer SUB may include at least one plastic film. The base layer SUB may be a flexible substrate and may include a plastic substrate, a glass substrate, a metal substrate, or an organic-inorganic hybrid material substrate. The display area DM-DA and the non-display area DM-NDA described with reference to FIG. 1 may be defined in the base layer SUB.

The circuit element layer DP-CL includes at least one intermediate insulating layer and a circuit element. In an embodiment, the intermediate insulating layer includes at least one intermediate inorganic layer and at least one intermediate organic layer. The circuit element includes signal lines, a driving circuit for the pixel, and the like. These will be described in further detail later.

The display element layer DP-OLED includes at least organic light emitting diodes. The display element layer DP-OLED may further include an organic layer, such as a pixel definition layer.

The encapsulation layer ENP is disposed on the display element layer DP-OLED and encapsulates the display element layer DP-OLED.

The display panel DP may further include a sealing member SL disposed between the circuit element layer DP-CL and the encapsulation layer ENP. The sealing member SL is disposed between the circuit element layer DP-CL and the encapsulation layer ENP to adhere the circuit element layer DP-CL and the encapsulation layer ENP. The sealing member SL blocks the display element layer DP-OLED from external moisture and oxygen together with the circuit element layer DP-CL and the encapsulation layer ENP.

The touch sensing unit TS obtains coordinate information of an external input. The touch sensing unit TS may be disposed on the encapsulation layer ENP. The touch sensing unit TS may be adhered to the encapsulation layer ENP by an adhesive layer and may be formed on the encapsulation layer ENP through a thin film process.

The touch sensing unit TS may sense the external input, for example, using an electrostatic capacitive method. However, the operation method of the touch sensing unit TS is not particularly limited, and the touch sensing unit TS according to an exemplary embodiment of the present disclosure may sense the external input using an electromagnetic induction method or a pressure sensing method.

Figure 3:
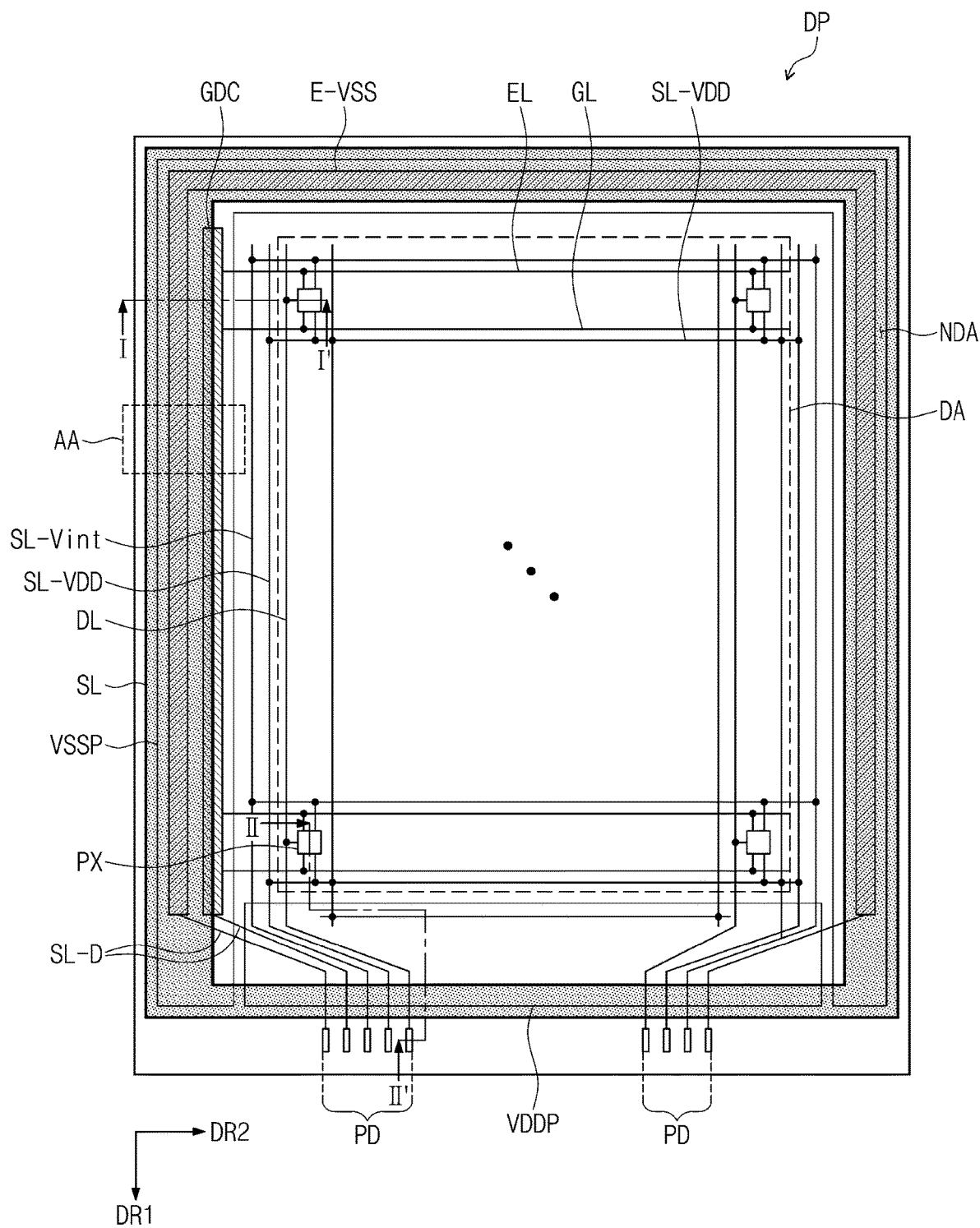
FIG. 3 is a plan view showing a display panel according to an exemplary embodiment of the present disclosure.

FIG. 3 is a plan view showing the display panel DP according to an exemplary embodiment of the present disclosure.

Referring to FIG. 3, the display panel DP includes a display area DA and a non-display area NDA when viewed in a plan view. In the present exemplary embodiment, the non-display area NDA may be defined along an edge of the display area DA. The display area DA and the non-display area NDA of the display panel DP respectively correspond to the display area DM-DA and the non-display area DM-NDA of the display module DM shown in FIG. 1. However, the display area DA and the non-display area NDA of the display panel DP need not necessarily be the same as the display area DM-DA and the non-display area DM-NDA of the display module DM and may be changed depending on structure and design of the display panel DP.

The display panel DP includes a plurality of pixels PX. The pixels PX are arranged in the display area DA. Each of the pixels PX includes an organic light emitting diode and a pixel driving circuit connected to the organic light emitting diode.

The display panel DP may include a plurality of signal lines and a pad part PD. The signal lines may include scan lines GL, data lines DL, light emitting lines EL, a control signal line SL-D, an initialization line SL-Vint, a voltage line SL-VDD, and a power supply line E-VSS. The signal lines and the pad part PD may be included in the circuit element layer DP-CL shown in FIG. 2.

Some lines of the scan lines GL, the data lines DL, the light emitting lines EL, the control signal line SL-D, the initialization line SL-Vint, the voltage line SL-VDD, and the power supply line E-VSS are arranged on a same layer, and the other lines are arranged on a different layer.

Each of the scan lines GL is connected to a corresponding pixel PX among the pixels PX, and each of the data lines DL is connected to a corresponding pixel PX among the pixels PX. In an embodiment, each of the light emitting lines EL is arranged parallel to a corresponding scan line among the scan lines GL. The control signal line SL-D applies control signals to a pixel driving circuit GDC. The initialization line SL-Vint applies an initialization voltage to the pixels PX. The voltage line SL-VDD is connected to the pixels PX and applies a source voltage (e.g., a first voltage) to the pixels PX. The voltage line SL-VDD includes a plurality of lines extending in the first direction DR1 and a plurality of lines extending in the second direction DR2. In an embodiment, the power supply line E-VSS is disposed in the non-display area NDA to surround three side surfaces of the display area DA. The power supply line E-VSS applies a common voltage (e.g., a second voltage) to the pixels PX. The common voltage may have a voltage level lower than the source voltage.

The display panel DP may further include the pixel driving circuit GDC. The pixel driving circuit GDC is disposed at a side portion of the non-display area NDA and connected to the scan lines GL and the light emitting lines EL.

The pixel driving circuit GDC may include a gate driving circuit (not shown) and a light emitting line driving circuit (not shown). The gate driving circuit (not shown) may apply signals to the scan lines GL, and the light emitting line driving circuit (not shown) may apply signals to the light emitting lines EL.

The pixel driving circuit GDC may be included in the circuit element layer DP-CL shown in FIG. 2. In an embodiment, the pixel driving circuit GDC may include a plurality of thin film transistors formed through a same process as the driving circuit of the pixels PX, for example, a low temperature polycrystalline silicon (LTPS) process or a low temperature polycrystalline oxide (LTPO) process.

The pad part PD includes a plurality of pads. Some pads of the pad part PD are connected to ends of the data lines DL, the control signal line SL-D, the initialization line SL-Vint, and the voltage line SL-VDD, and the other pads of the pad part PD are connected to touch signal lines of the touch sensing unit TS.

Although not shown in figures, the display panel DP may further include a bank (not shown) disposed between the display area DA and the pad part PD. In addition, the display panel DP may further include a dam portion (not shown) surrounding the edge of the display area DA. When a specified layer is formed by a printing method during manufacture of the display panel DP, the bank and the dam portion may prevent or substantially prevent the specified layer from overflowing the bank or the dam portion.

When viewed in a plan view, the sealing member SL is disposed in the non-display area NDA of the display panel DP to surround the display area DA. In an embodiment, the sealing member SL is disposed to overlap with the power supply line E-VSS. In an embodiment, the sealing member SL overlaps with a portion of the pixel driving circuit GDC.

The display panel DP may further include an auxiliary power supply pattern VSSP and an auxiliary voltage pattern VDDP.

In an embodiment, when viewed in a plan view, the auxiliary power supply pattern VSSP is electrically connected to the power supply line E-VSS and overlaps with the sealing member SL.

In an embodiment, when viewed in a plan view, the auxiliary voltage pattern VDDP is electrically connected to the voltage line SL-VDD and overlaps with the sealing member SL. The auxiliary voltage pattern VDDP is disposed between the pad part PD and the display area DA when viewed in a plan view.

Figure 4:
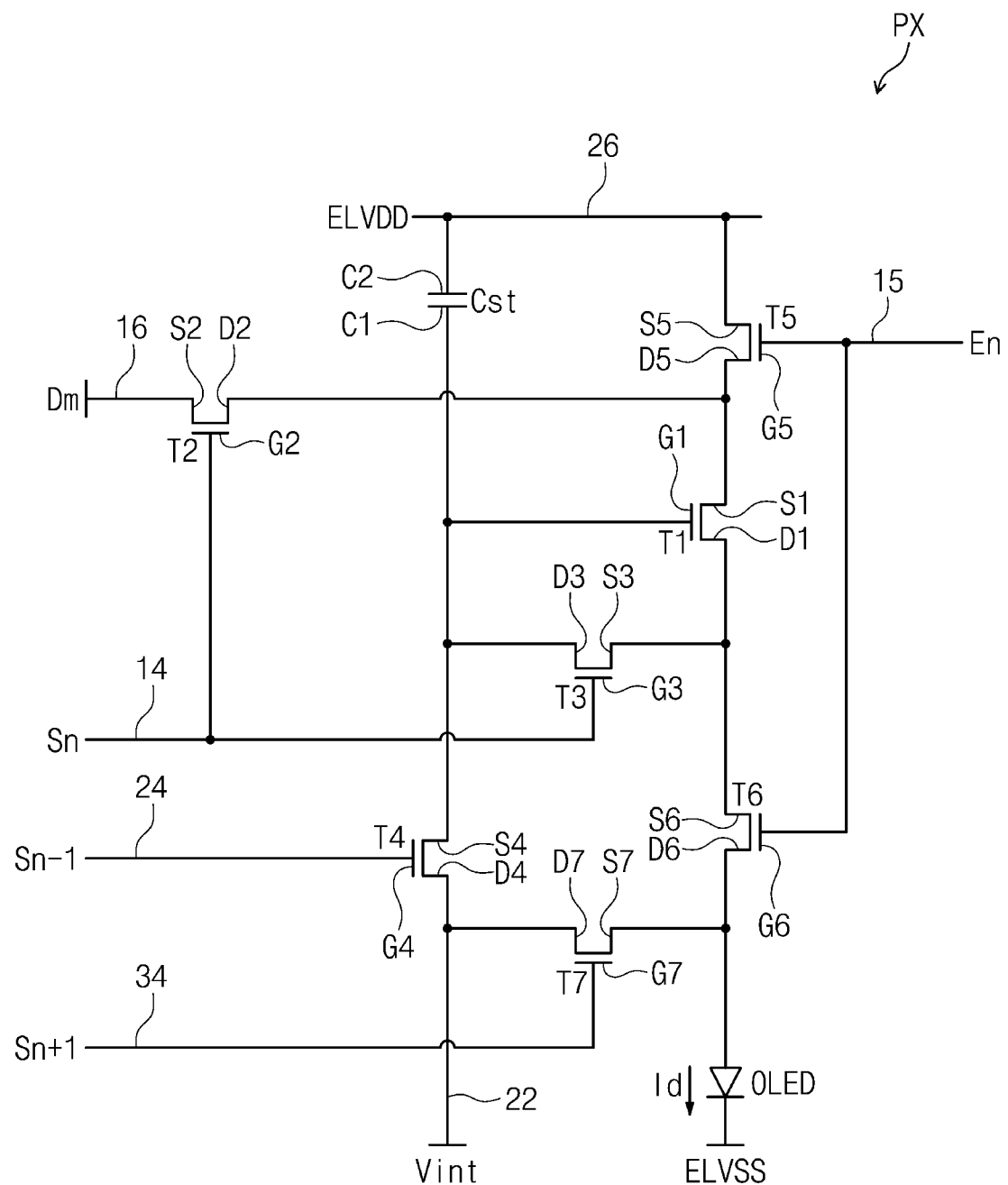
FIG. 4 is an equivalent circuit diagram showing a pixel according to an exemplary embodiment of the present disclosure.

FIG. 4 is an equivalent circuit diagram showing a pixel PX of FIG. 3.

The pixel PX according to an exemplary embodiment of the present disclosure may include a plurality of thin film transistors T1 to T7, a storage capacitor Cst, and an organic light emitting diode OLED.

In an embodiment, the thin film transistors T1 to T7 include a driving transistor T1, a switching transistor T2, a compensating transistor T3, an initializing transistor T4, a first light emitting control transistor T5, a second light emitting control transistor T6, and a bypass transistor T7.

The pixel PX includes a first scan line 14 transmitting an n-th scan signal Sn to the switching transistor T2 and the compensating transistor T3, a second scan line 24 transmitting an (n−1)th scan signal Sn−1 to the initializing transistor T4, a third scan line 34 transmitting an (n+1)th scan signal Sn+1 to the bypass transistor T7, a light emitting line 15 transmitting a light emitting control signal En to the first light emitting control transistor T5 and the second light emitting control transistor T6, a data line 16 transmitting a data signal Dm, a voltage line 26 transmitting the source voltage ELVDD, and an initializing line 22 transmitting an initializing voltage Vint to initialize the driving transistor T1.

A gate electrode G1 of the driving transistor T1 is connected to a first electrode C1 of the storage capacitor Cst. A source electrode S1 of the driving transistor T1 is connected to the voltage line 26 via the first light emitting control transistor T5. A drain electrode D1 of the driving transistor T1 is electrically connected to an anode of the organic light emitting diode OLED via the second light emitting control transistor T6. The driving transistor T1 receives the data signal Dm in response to a switching operation of the switching transistor T2 to provide the organic light emitting diode OLED with a driving current Id.

A gate electrode G2 of the switching transistor T2 is connected to the first scan line 14. A source electrode S2 of the switching transistor T2 is connected to the data line 16. A drain electrode D2 of the switching transistor T2 is connected to the source electrode S1 of the driving transistor T1 and connected to the voltage line 26 via the first light emitting control transistor T5. The switching transistor T2 is turned on in response to the n-th scan signal Sn applied thereto through the first scan line 14 to perform the switching operation that transmits the data signal Dm applied to the data line 16 to the source electrode S1 of the driving transistor T1.

A gate electrode G3 of the compensating transistor T3 is connected to the first scan line 14. A source electrode S3 of the compensating transistor T3 is connected to the drain electrode D1 of the driving transistor T1 and connected to the anode of the organic light emitting diode OLED via the second light emitting control transistor T6. A drain electrode D3 of the compensating transistor T3 is connected to the first electrode C1 of the storage capacitor Cst, a source electrode S4 of the initializing transistor T4, and the gate electrode G1 of the driving transistor T1. The compensating transistor T3 is turned on in response to the n-th scan signal Sn applied thereto through the first scan line 14 to connect the gate electrode G1 of the driving transistor T1 to the drain electrode D1 of the driving transistor T1, and, thus, the driving transistor T1 is connected in a diode configuration.

A gate electrode G4 of the initializing transistor T4 is connected to the second scan line 24. A drain electrode D4 of the initializing transistor T4 is connected to the initializing line 22. The source electrode S4 of the initializing transistor T4 is connected to the first electrode C1 of the storage capacitor Cst, the drain electrode D3 of the compensating transistor T3, and the gate electrode G1 of the driving transistor T1. The initializing transistor T4 is turned on in response to the (n−1)th scan signal Sn−1 applied thereto through the second scan line 24 and applies the initializing voltage Vint to the gate electrode G1 of the driving transistor T1 to initialize a voltage of the gate electrode G1 of the driving transistor T1.

A gate electrode G5 of the first light emitting control transistor T5 is connected to the light emitting line 15. The first light emitting control transistor T5 is connected between the voltage line 26 and the driving transistor T1. A source electrode S5 of the first light emitting control transistor T5 is connected to the voltage line 26. A drain electrode D5 of the first light emitting control transistor T5 is connected to the source electrode S1 of the driving transistor T1 and the drain electrode D2 of the switching transistor T2. When the light emitting control signal En is applied to the gate electrode G5 of the first light emitting control transistor T5, the first light emitting control transistor T5 is turned on, and, thus, the driving current Id flows through the organic light emitting diode OLED. The first light emitting control transistor T5 may determine a timing at which the driving current Id flows through the organic light emitting diode OLED.

A gate electrode G6 of the second light emitting control transistor T6 is connected to the light emitting line 15. The second light emitting control transistor T6 is connected between the driving transistor T1 and the organic light emitting diode OLED. A source electrode S6 of the second light emitting control transistor T6 is connected to the drain electrode D1 of the driving transistor T1 and the source electrode S3 of the compensating transistor T3. A drain electrode D6 of the second light emitting control transistor T6 is electrically connected to the anode of the organic light emitting diode OLED. The first light emitting control transistor T5 and the second light emitting control transistor T6 are turned on in response to the light emitting control signal En provided through the light emitting line 15. When the light emitting control signal En is applied to the gate electrode G6 of the second light emitting control transistor T6, the second light emitting control transistor T6 is turned on, and, thus, the driving current Id flows through the organic light emitting diode OLED. The second light emitting control transistor T6 may determine the timing at which the driving current Id flows through the organic light emitting diode OLED.

A gate electrode G7 of the bypass transistor T7 is connected to the third scan line 34. A source electrode S7 of the bypass transistor T7 is connected to the anode of the organic light emitting diode OLED. A drain electrode D7 of the bypass transistor T7 is connected to the initializing line 22. The bypass transistor T7 is turned on in response to the (n+1)th scan signal Sn+1 applied thereto through the third scan line 34 to initialize the anode of the organic light emitting diode OLED.

A second electrode C2 of the storage capacitor Cst is connected to the voltage line 26. The first electrode C1 of the storage capacitor Cst is connected to the gate electrode G1 of the driving transistor T1, the drain electrode D3 of the compensating transistor T3, and the source electrode S4 of the initializing transistor T4.

A cathode of the organic light emitting diode OLED receives a reference voltage ELVSS. The organic light emitting diode OLED receives the driving current Id from the driving transistor T1 to emit a light.

In the pixel PX according to an exemplary embodiment of the present disclosure, the gate electrodes G2, G3, G4, and G7 of the switching transistor T2, the compensating transistor T3, the initializing transistor T4, and the bypass transistor T7 may receive signals from the gate driving circuit (not shown) of the pixel driving circuit GDC described with reference to FIG. 3.

In the pixel PX according to an exemplary embodiment of the present disclosure, the first light emitting control transistor T5 and the second light emitting control transistor T6 may receive signals from the light emitting line driving circuit (not shown) of the pixel driving circuit GDC described with reference to FIG. 3.

In another exemplary embodiment of the present disclosure, the number and connection of the transistors T1 to T7 in the pixels PX may be changed in various ways.

Figure 5:
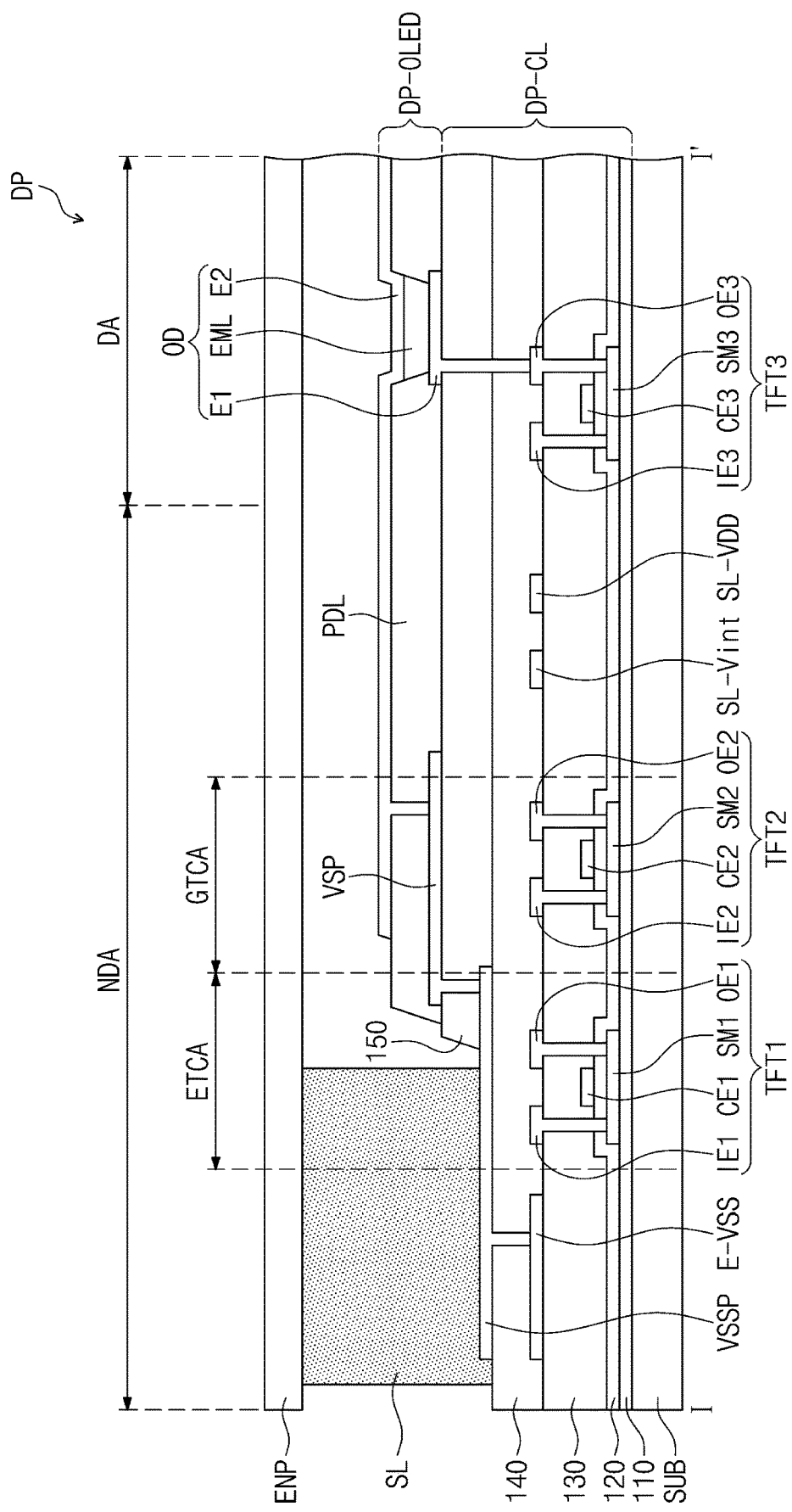
FIG. 5 is a cross-sectional view taken along the line I-I' of FIG. 3.
Figure 6:
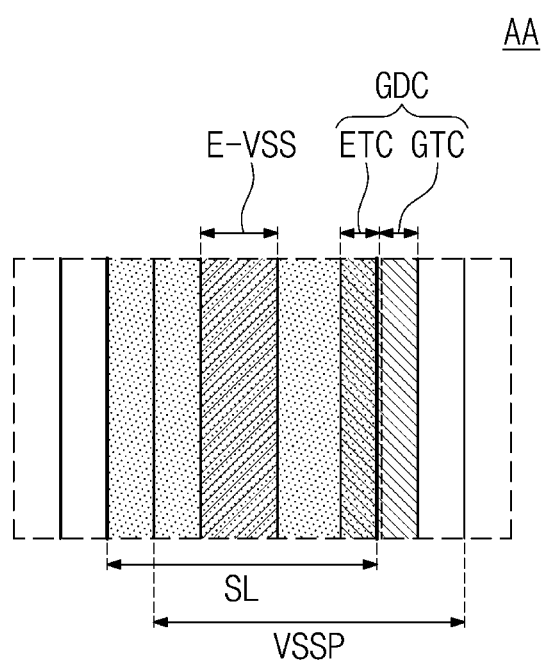
FIG. 6 is a view showing a region "AA" of FIG. 3.

FIG. 5 is a cross-sectional view taken along the line I-I' of FIG. 3; and FIG. 6 is a view showing a region "AA" of FIG. 3.

Referring to FIGS. 2 and 5, the base layer SUB may be formed of various materials, such as glass, metal, or plastic. In an embodiment, the plastic may be polyimide (PI), polyethylene naphthalate (PEN), polyethylene terephthalate (PET), polyarylate, polycarbonate (PC), polyetherimide (PEI), or polyether sulfone (PES).

In an embodiment, the display area DA and the non-display area NDA of the display panel DP may be substantially identically defined in the base layer SUB.

The circuit element layer DP-CL is disposed on the base layer SUB.

The circuit element layer DP-CL may include the pixel driving circuit GDC, the signal lines, and the pad part PD, which are described with reference to FIG. 3, and the transistors T1 to T7 of the pixel PX described with reference to FIG. 4.

Referring to FIGS. 3 to 6, a light emitting line driving circuit ETC of the pixel driving circuit GDC is disposed farther from the display area DA of the display panel DP than a gate driving circuit GTC when viewed in a plan view. Each of the gate driving circuit GTC and the light emitting line driving circuit ETC may include a plurality of transistors and electronic elements.

FIG. 5 shows a light emitting line driving circuit area ETCA in which the light emitting line driving circuit ETC is disposed and a gate driving circuit area GTCA in which the gate driving circuit GTC is disposed. FIG. 5 shows a first transistor TFT1 included in the light emitting line driving circuit ETC and a second transistor TFT2 included in the gate driving circuit GTC as representative examples. In addition, FIG. 5 shows a third transistor TFT3 included in the pixel PX.

The first transistor TFT1 includes a first semiconductor pattern SM1, a first control electrode CE1, a first input electrode IE1, and a first output electrode OE1.

The second transistor TFT2 includes a second semiconductor pattern SM2, a second control electrode CE2, a second input electrode IE2, and a second output electrode OE2.

The third transistor TFT3 includes a third semiconductor pattern SM3, a third control electrode CE3, a third input electrode IE3, and a third output electrode OE3.

The circuit element layer DP-CL may include a buffer layer 110 and first, second, third, and fourth insulating layers 120, 130, 140, and 150.

The buffer layer 110 is disposed on the base layer SUB. The buffer layer 110 is disposed to planarize an upper surface of the base layer SUB or to prevent or substantially prevent a foreign matter from entering the first, second, and third semiconductor patterns SM1, SM2, and SM3 of the first, second, and third transistors TFT1, TFT2, and TFT3. In an embodiment, the buffer layer 110 may be formed of silicon oxide or silicon nitride.

The first, second, and third semiconductor patterns SM1, SM2, and SM3 may be disposed on the buffer layer 110.

The first insulating layer 120 may be disposed on the first, second, and third semiconductor patterns SM1, SM2, and SM3. The first insulating layer 120 may include an organic or inorganic insulating layer.

The first, second, and third control electrodes CE1, CE2, and CE3 may be disposed on the first insulating layer 120.

The second insulating layer 130 may be disposed on the first, second, and third control electrodes CE1, CE2, and CE3. The second insulating layer 130 may include an organic or inorganic insulating layer.

The first, second, and third input electrodes IE1, IE2, and IE3 and the first, second, and third output electrodes OE1, OE2, and OE3 may be disposed on the second insulating layer 130.

The first input electrode IE1 and the first output electrode OE1 are spaced apart from each other and connected to the first semiconductor pattern SM1 through contact holes (not shown) formed through the second insulating layer 130.

The second input electrode IE2 and the second output electrode OE2 are spaced apart from each other and connected to the second semiconductor pattern SM2 through contact holes (not shown) formed through the second insulating layer 130.

The third input electrode IE3 and the third output electrode OE3 are spaced apart from each other and connected to the third semiconductor pattern SM3 through contact holes (not shown) formed through the second insulating layer 130.

According to another exemplary embodiment of the present disclosure, positions of the first, second, and third semiconductor patterns SM1, SM2, and SM3, the first, second, and third control electrodes CE1, CE2, and CE3, the first, second, and third input electrodes IE1, IE2, and IE3, and the first, second, and third output electrodes OE1, OE2, and OE3 may be varied from the structure of each of the first, second, and third semiconductor patterns SM1, SM2, and SM3 shown in FIG. 5.

According to another exemplary embodiment of the present disclosure, some layers of the first, second, and third transistors TFT1, TFT2, and TFT3 may be formed on a same layer as and formed of a same material as those of the auxiliary power supply pattern VSSP. For example, in an embodiment, the third input electrode IE3 and the third output electrode OE3 of the third transistor TFT3 are disposed on a same layer as the power supply line E-VSS; however according to another embodiment, the third input electrode IE3 and the third output electrode OE3 of the third transistor TFT3 may be disposed on a same layer as the auxiliary power supply pattern VSSP and may be connected to the third semiconductor pattern SM3 through contact holes formed through the second and third insulating layers 130 and 140.

According to another exemplary embodiment of the present disclosure, a metal layer for the first, second, and third transistors TFT1, TFT2, and TFT3 is formed when the auxiliary power supply pattern VSSP is formed, and a design margin of the first, second, and third transistors TFT1, TFT2, and TFT3 may be improved, and, as a result, a display quality may be improved.

Referring to FIG. 5 again, the power supply line E-VSS may be disposed on the second insulating layer 130. In an exemplary embodiment of the present disclosure, the power supply line E-VSS may be disposed on a same layer as the first, second, and third input electrodes IE1, IE2, and IE3 and the first, second, and third output electrodes OE1, OE2, and OE3. In an exemplary embodiment of the present disclosure, the initializing line SL-Vint and the voltage line SL-VDD may be disposed on a same layer as the power supply line E-VSS.

The power supply line E-VSS may include a single layer or a plurality of layers. As an example, the power supply line E-VSS may have a structure in which titanium/aluminum/titanium (Ti/Al/Ti) are sequentially stacked.

The third insulating layer 140 may be disposed on the power supply line E-VSS and the first, second, and third transistors TFT1, TFT2, and TFT3. The third insulating layer 140 may include an organic or inorganic insulating layer. The third insulating layer 140 may be defined as a first intermediate insulating layer.

The auxiliary power supply pattern VSSP may be disposed on the third insulating layer 140. The auxiliary power supply pattern VSSP may overlap with the power supply line E-VSS. The auxiliary power supply pattern VSSP may be electrically connected to the power supply line E-VSS through a contact hole (not shown) formed through the third insulating layer 140.

In an embodiment, the auxiliary power supply pattern VSSP may be formed of a material with a melting point higher than that of the first control electrode CE1, the first input electrode IE1, and the first output electrode OE1.

The auxiliary power supply pattern VSSP may include a metal material, e.g., molybdenum (Mo).

The fourth insulating layer 150 may be disposed on the auxiliary power supply pattern VSSP. The fourth insulating layer 150 may overlap with a portion of the auxiliary power supply pattern VSSP. The fourth insulating layer 150 may include an organic or inorganic insulating layer. The fourth insulating layer 150 may be defined as a second intermediate insulating layer.

The display element layer DP-OLED may include a pixel definition layer PDL and an organic light emitting element OD.

The pixel definition layer PDL is disposed on the fourth insulating layer 150. The pixel definition layer PDL is provided with a plurality of openings defined therethrough. The organic light emitting element OD may be provided in each opening.

The organic light emitting element OD includes a first electrode E1, a second electrode E2, and a light emitting layer EML. The first electrode E1 may be disposed on the circuit element layer DP-CL. The first electrode E1 may be electrically connected to the third transistor TFT3 after passing through the third and fourth insulating layers 140 and 150. The first electrode E1 may be provided in a plural number. At least portions of each of the first electrodes E1 may be exposed through the openings.

The second electrode E2 is disposed on the first electrode E1. The second electrode E2 may overlap with the first electrodes E1 and the pixel definition layer PDL. When the organic light emitting element OD is provided in a plural number, the second electrode E2 of each of the organic light emitting elements OD may receive the same voltage. Accordingly, an additional patterning process required to form the second electrode E2 may be omitted. In an embodiment, the second electrode E2 may be provided in a plural number such that the second electrodes E2 respectively correspond to the openings.

The light emitting layer EML is disposed between the first electrode E1 and the second electrode E2. The light emitting layer EML may be provided in a plural number to respectively correspond to the openings. The organic light emitting element OD may activate the light emitting layer EML according to a difference in electric potential between the first electrode E1 and the second electrode E2 to generate the light.

Although not shown in the figures, the organic light emitting element OD may further include an electron control layer disposed between the first electrode E1 and the light emitting layer EML and a hole control layer disposed between the light emitting layer EML and the second electrode E2.

The display element layer DP-OLED may further include an auxiliary pattern VSP disposed on the fourth insulating layer 150. The auxiliary pattern VSP may be disposed on a same layer as the first electrode E1.

The auxiliary pattern VSP may be disposed in the non-display area NDA of the display panel DP. The auxiliary pattern VSP may be connected to the auxiliary power supply pattern VSSP through a contact hole (not shown) formed through the fourth insulating layer 150.

The second electrode E2 may be connected to the auxiliary pattern VSP through a contact hole (not shown) formed through the pixel definition layer PDL in the non-display area NDA.

The power supply line E-VSS may apply a common voltage to the second electrode E2 through the auxiliary power supply pattern VSSP and the auxiliary pattern VSP.

The sealing member SL may overlap with the auxiliary power supply pattern VSSP. The sealing member SL may be disposed between the auxiliary power supply pattern VSSP and the encapsulation layer ENP and may make contact with the auxiliary power supply pattern VSSP.

The sealing member SL may include a light-curable resin or a heat-curable resin to be coupled to the auxiliary power supply pattern VSSP, the third insulating layer 140, and the encapsulation layer ENP.

The sealing member SL may overlap with a portion of the pixel driving circuit GDC of FIG. 3, i.e., the light emitting line driving circuit ETC. Accordingly, the non-display area NDA of the display panel DP may be reduced.

The auxiliary power supply pattern VSSP may cover metal layers of the circuit element layer DP-CL overlapped with the sealing member SL. In an embodiment, the auxiliary power supply pattern VSSP may cover components of the power supply line E-VSS and the light emitting line driving circuit ETC, i.e., the first transistor TFT1.

The sealing member SL may be formed by providing a curable material between the auxiliary power supply pattern VSSP and the encapsulation layer ENP and irradiating a laser beam downward from an upper side of the encapsulation layer ENP. When the laser beam is irradiated to the curable material, if a temperature of metal layers disposed in an area overlapped with the curable material, for example, elements of the pixel driving circuit GDC and the power supply line E-VSS, rises above a melting point thereof, defects may occur.

However, according to the display apparatus of an exemplary embodiment of present disclosure, when the auxiliary power supply pattern VSSP is disposed above the pixel driving circuit GDC and the power supply line E-VSS to overlap with the sealing member SL, the pixel driving circuit GDC and the power supply line E-VSS may be prevented or substantially prevented from being made defective due to the laser beam. To this end, the auxiliary power supply pattern VSSP may include a material with a melting point higher than that of the metal layer of the power supply line E-VSS. In a case in which the metal layer of the power supply line E-VSS includes a plurality of layers, the auxiliary power supply pattern VSSP may include a material with a melting point higher than that of the metal layer with a lowest melting point among the layers of the power supply line E-VSS.

In addition, the auxiliary power supply pattern VSSP is connected to the power supply line E-VSS to reduce a resistance of a line supplying the common voltage, and, thus, the common voltage may be uniformly applied to the second electrode E2.

The light emitting line driving circuit ETC is turned on for most of a pixel operation period to reduce an influence caused by a parasitic capacitor formed between the auxiliary power supply pattern VSSP and the light emitting line driving circuit ETC. Accordingly, the light emitting line driving circuit ETC may be formed to overlap with the power supply pattern VSSP to reduce the non-display area NDA of the display panel DP.

The gate driving circuit GTC is turned off for most of the pixel operation period and is relatively affected by a parasitic capacitor formed between the gate driving circuit GTC and other elements. That is, since a pulse signal output from the gate driving circuit GTC has a pulse width corresponding to a very small period (less than about 1%) of the pixel operation period, a waveform damage due to a delay caused by the parasitic capacitor may cause defects in an operation of circuits. Accordingly, the gate driving circuit GTC may be disposed not to overlap with the power supply pattern VSSP in an exemplary embodiment of the present disclosure.

Figure 7:
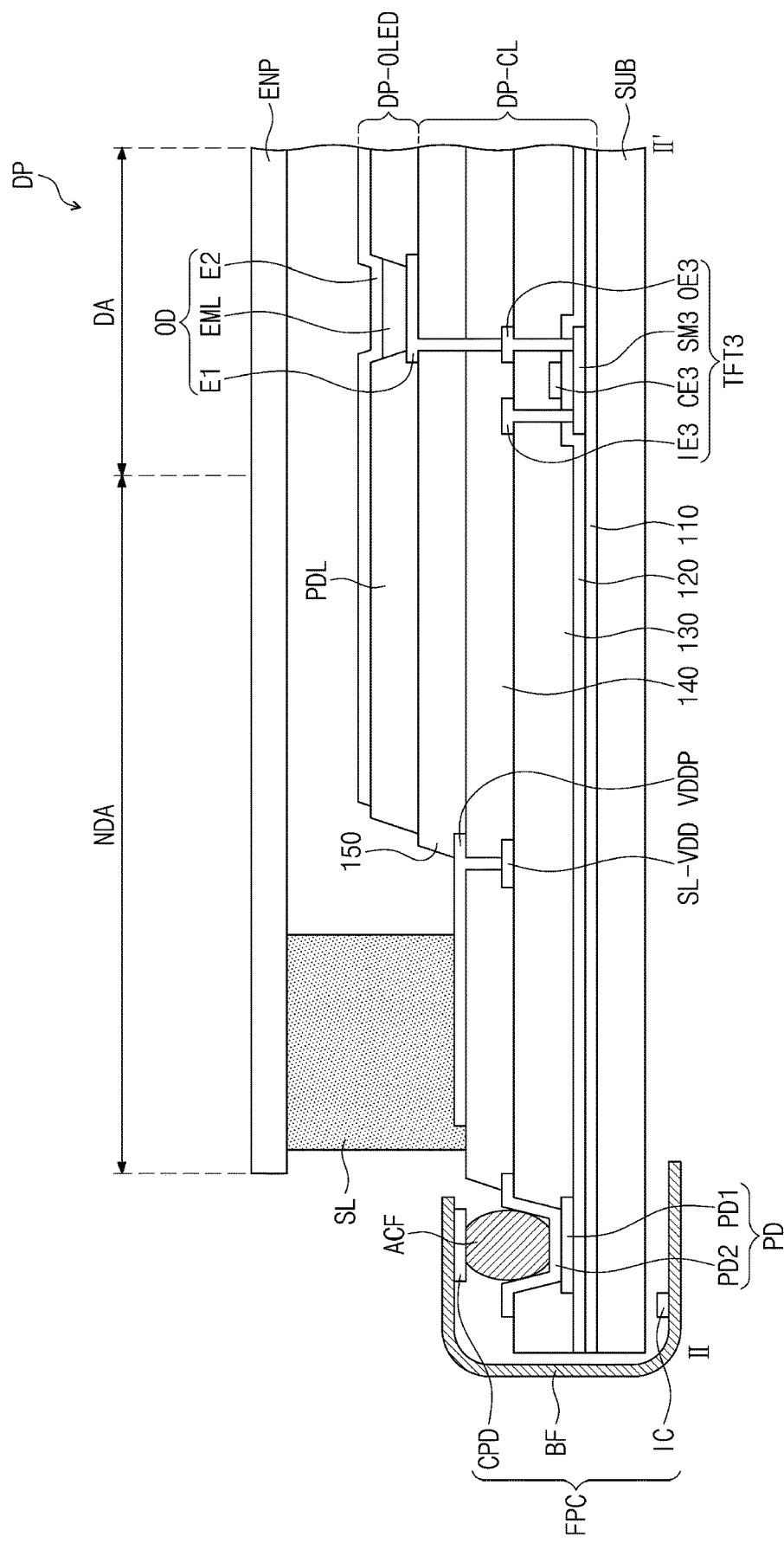
FIG. 7 is a cross-sectional view taken along the line II-II' of FIG. 3.

FIG. 7 is a cross-sectional view taken along the line II-II' of FIG. 3.

The pad part PD may include a first pad layer PD1 and a second pad layer PD2.

The first pad layer PD1 may be disposed on a same layer as the first, second, and third control electrodes CE1, CE2, and CE3. The second pad layer PD2 may be disposed on a same layer as the voltage line SL-VDD. The second pad layer PD2 may make contact with the first pad layer PD1 through a contact hole (not shown) formed through the second insulating layer 130.

In an embodiment, the display panel DP may further include a flexible printed circuit board FPC. The flexible printed circuit board FPC may be bent toward a rear surface of the display panel DP after being attached to the display panel DP.

The flexible printed circuit board FPC may be connected to the pad part DP through a conductive adhesive member ACF. The flexible printed circuit board FPC may include a flexible base film BF, a circuit board pad CPD, and an integrated circuit chip IC. The circuit board pad CPD may be disposed on the base film BF to make contact with the conductive adhesive member ACF. The integrated circuit chip IC may be mounted on the base film BF and may apply signals required to drive the display panel DP through the circuit board pad CPD.

The voltage line SL-VDD may be disposed on a same layer as the power supply line E-VSS.

The auxiliary voltage pattern VDDP may be disposed on the third insulating layer 140. The auxiliary voltage pattern VDDP may overlap with the voltage line SL-VDD. The auxiliary voltage pattern VDDP may be electrically connected to the voltage line SL-VDD through a contact hole (not shown) formed through the third insulating layer 140.

The auxiliary voltage pattern VDDP may be disposed on a same layer as and may include a same material as the auxiliary power supply pattern VSSP described with reference to FIG. 5.

The sealing member SL may overlap with the auxiliary voltage pattern VDDP. The sealing member SL may be disposed between the auxiliary voltage pattern VDDP and the encapsulation layer ENP and may make contact with the auxiliary voltage pattern VDDP.

The auxiliary voltage pattern VDDP may be connected to the voltage line SL-VDD to reduce the resistance of the line applying the source voltage, and the source voltage may be uniformly applied to the first light emitting control transistor T5 described with reference to FIG. 4.

Figure 8:
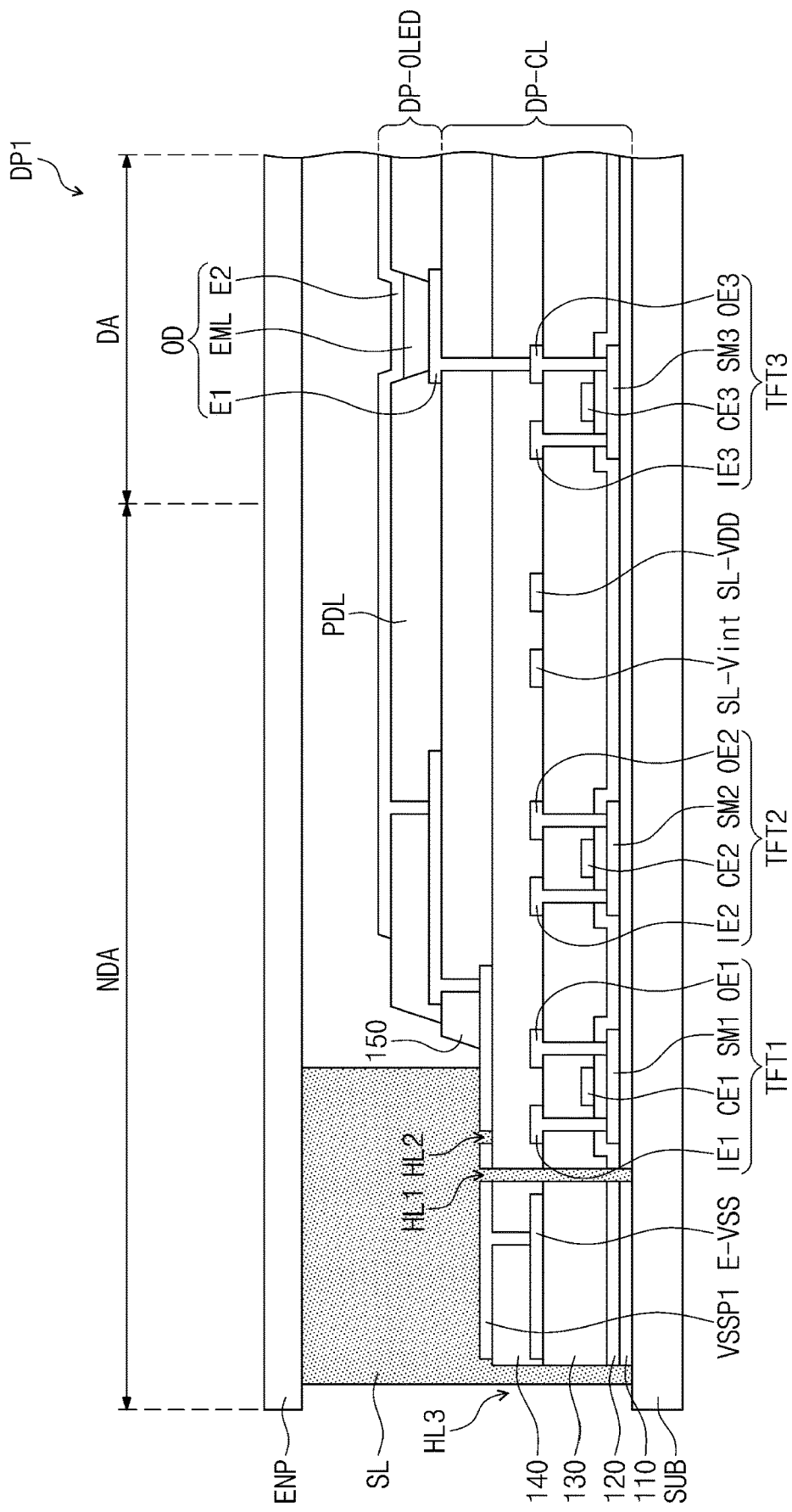
FIG. 8 is a cross-sectional view showing a portion of a display panel of a display apparatus according to another exemplary embodiment of the present disclosure.

FIG. 8 is a cross-sectional view showing a portion of a display panel DP1 of a display apparatus according to another exemplary embodiment of the present disclosure. FIG. 8 shows a cross-section corresponding to the line I-I' of FIG. 3 in the display panel DP1 according to another exemplary embodiment of the present disclosure.

An auxiliary power supply pattern VSSP1 of the display panel DP1 described with reference to FIG. 8 has substantially the same structure as the auxiliary power supply pattern VSSP described with reference to FIG. 5 except that the auxiliary power supply pattern VSSP1 includes one or more holes HL1 and HL2.

As shown in FIG. 8, one first hole HL1 and one second hole HL2 are defined through the auxiliary power supply pattern VSSP1; however, the number of each of the first and second holes HL1 and HL2 is not limited to one. That is, each of the first and second holes HL1 and HL2 may be provided in a plural number through the auxiliary power supply pattern VSSP1, or only one of the first and second holes HL1 and HL2 may be provided through the auxiliary power supply pattern VSSP1.

The first hole HL1 and the second hole HL2 may be provided to overlap with the sealing member SL. The first hole HL1 and the second hole HL2 may penetrate through the auxiliary power supply pattern VSSP1.

In an embodiment, the first hole HL1 may further penetrate through at least one of the buffer layer 110 and the first, second, and third insulating layers 120, 130, and 140 in order of the third, second, and first insulating layers 140, 130, and 120 and the buffer layer 110. FIG. 8 shows, as a representative example, the first hole HL1 that penetrates through all of the buffer layer 110 and the first, second, and third insulating layers 120, 130, and 140.

In an embodiment, the second hole HL2 may penetrate through the auxiliary power supply pattern VSSP1 and may not penetrate through the first, second, third, and fourth insulating layers 120, 130, 140, and 150.

In an embodiment, a third hole HL3 may be defined through the third insulating layer 140. The third hole HL3 may overlap with the sealing member SL and may not overlap with the auxiliary power supply pattern VSSP1. The third hole HL3 may further penetrate through at least one of the buffer layer 110 and the first and second insulating layers 120 and 130 in order of the second and first insulating layers 130 and 120 and the buffer layer 110. FIG. 8 shows, as a representative example, the third hole HL3 that penetrates through all of the buffer layer 110 and the first and second insulating layers 120 and 130.

In an embodiment, the sealing member SL may be formed of a material obtained by mixing the curable material with a glass raw material. The sealing member SL may be more securely adhered to the insulating layer and the base layer SUB formed of a glass material than a metal material.

According to the display apparatus of an exemplary embodiment of the present disclosure, an area in which the sealing member SL makes contact with the insulating layers 110, 120, 130, and 140 and the base layer SUB increases due to at least one of the first, second, and third holes HL1, HL2, and HL3, and, thus, a mechanical strength of the display panel DP1 may be improved.

Figure 9:
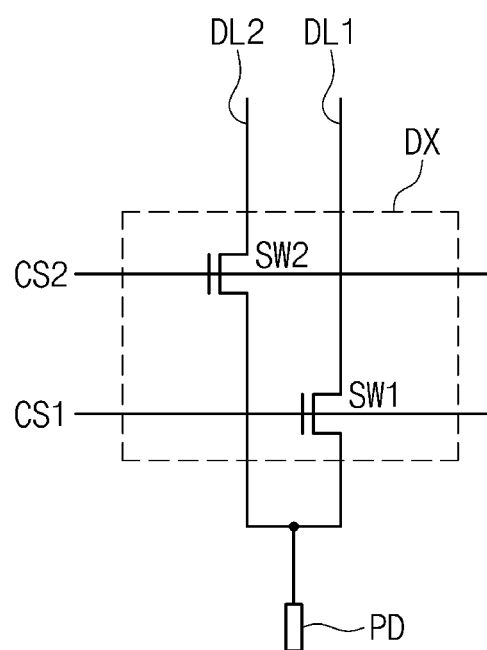
FIG. 9 is a circuit diagram showing a portion of a display panel of a display apparatus according to another exemplary embodiment of the present disclosure.
Figure 10:
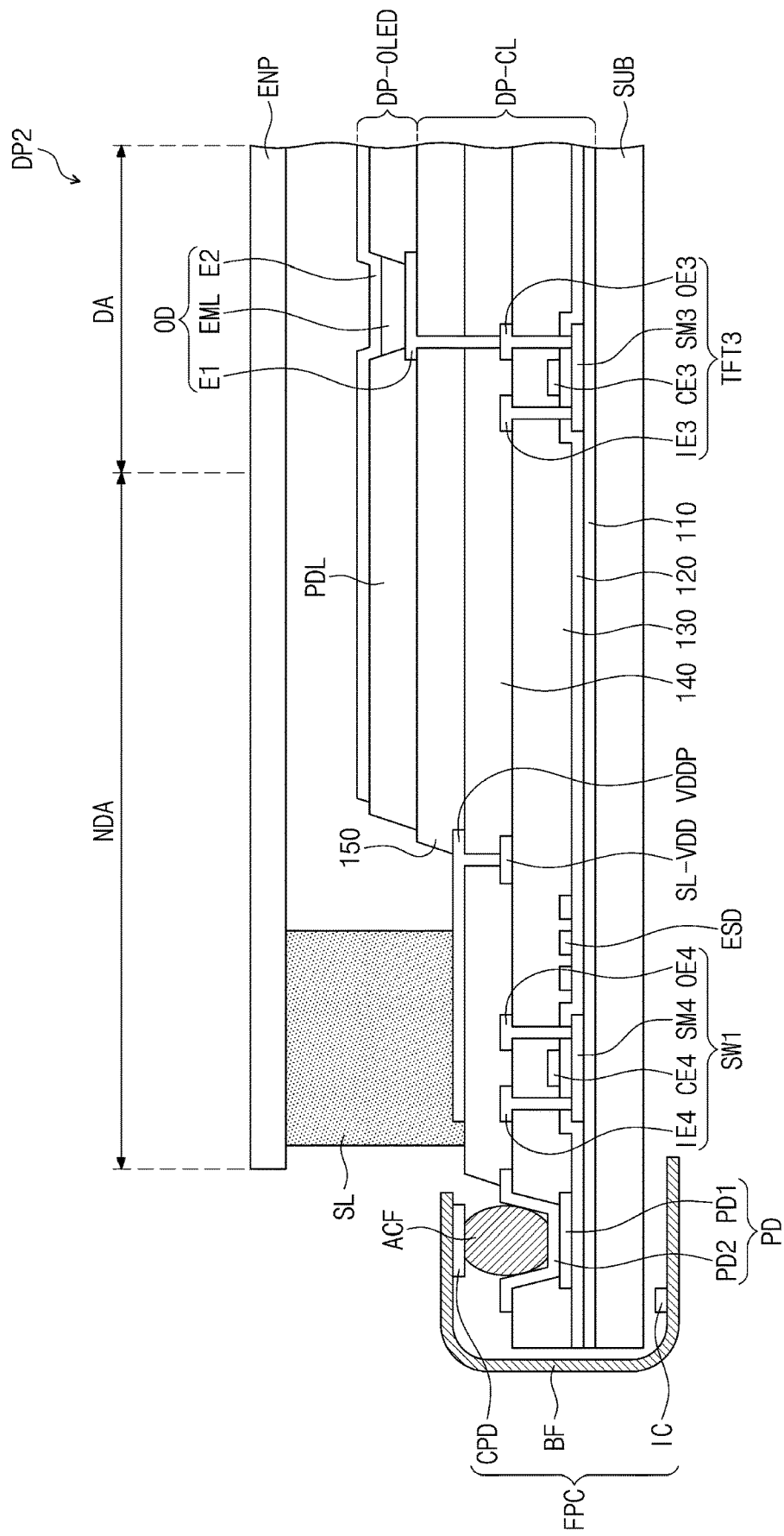
FIG. 10 is a cross-sectional view showing the portion of the display panel according to the exemplary embodiment of FIG. 9.

FIG. 9 is a circuit diagram showing a portion of a display panel of a display apparatus according to another exemplary embodiment of the present disclosure; and FIG. 10 is a cross-sectional view showing the portion of the display panel DP2 according to the exemplary embodiment of FIG. 9. FIG. 10 shows a cross-section corresponding to the line II-II' of FIG. 3 in the display panel DP2 according to another exemplary embodiment of the present disclosure.

Referring to FIG. 9, one pad part PD may be connected to at least two data lines DL1 and DL2 by a demultiplexer DX. FIG. 9 shows one pad part PD connected to first and second data lines DL1 and DL2 as a representative example.

The demultiplexer DX may include a first switching device SW1 and a second switching device SW2.

The first switching device SW1 may be turned on in response to a first control signal CS1, and the second switching device SW2 may be turned on in response to a second control signal CS2. The first and second switching devices SW1 and SW2 may be turned on at different timings from each other.

The signal applied to the pad part PD may provide different data from each other to the first and second data lines DL1 and DL2 by the first and second switching devices SW1 and SW2 turned on at different timings from each other.

Referring to FIG. 10, the demultiplexer DX of the display panel DP2 according to another exemplary embodiment may be provided to the circuit element layer DP-CL. The first and second switching devices SW1 and SW2 included in the demultiplexer DX may have the same structure as the third transistor TFT3. FIG. 10 shows the first switching device SW1 as a representative example.

The first switching device SW1 may include a fourth semiconductor pattern SM4, a fourth control electrode CE4, a fourth input electrode IE4, and a fourth output electrode OE4.

In addition, the circuit element layer DP-CL may further include an anti-static pattern ESD. The anti-static pattern ESD may be provided in a plural number, and each anti-static pattern ESD may have an island shape. The anti-static patterns ESD may be provided in a floating state and spaced apart from each other. The anti-static patterns ESD may be formed on various layers and may include a metal material. In an exemplary embodiment of the present disclosure, the anti-static pattern ESD may be disposed on a same layer as the third control electrode CE3 of the third transistor TFT3. The anti-static pattern ESD may prevent or substantially prevent an external static electricity from entering the elements disposed in the display area DA.

The auxiliary voltage pattern VDDP may cover the demultiplexer DX, i.e., the first switching device SW1. The first switching device SW1 may overlap with the sealing member SL.

In an embodiment, the auxiliary voltage pattern VDDP may cover the anti-static pattern ESD. The anti-static pattern ESD may overlap with the sealing member SL.

When the laser beam is irradiated to the curable material while the sealing member SL is formed, if a temperature of the first switching device SW1 and the anti-static pattern ESD, which are disposed in an area overlapped with the curable material, rises above a melting point thereof, defects may occur.

However, according to the display apparatus of an exemplary embodiment of present disclosure, the auxiliary voltage pattern VDDP may include a material with a melting point higher than that of the fourth control electrode CE4, the fourth input electrode IE4, and the fourth output electrode OE4.

When the auxiliary voltage pattern VDDP is disposed to overlap with the first switching device SW1 and the anti-static pattern ESD, the first switching device SW1 and the anti-static pattern ESD may be prevented or substantially prevented from being made defective due to the laser beam.

Although some exemplary embodiments of the present invention have been described, it is to be understood that the present invention should not be limited to these exemplary embodiments, but various changes and modifications can be made by one of ordinary skill in the art within the spirit and scope of the present invention as herein claimed.

Therefore, the disclosed subject matter should not be limited to any single embodiment described herein, and the scope of the present inventive concept shall be determined according to the attached claims.

What is claimed is:

1. An organic light emitting display apparatus comprising:
a base layer comprising a display area and a non-display area adjacent to the display area;
a circuit element layer comprising a first transistor in the non-display area including a first semiconductor pattern and a first control electrode overlapping the first semiconductor pattern, a power supply line to receive a common voltage being farther from the display area than the first transistor, and an auxiliary power supply pattern directly electrically connected to the power supply line; and
a display element layer comprising a first electrode on the circuit element layer, a light emitting layer on the first electrode, and a second electrode on the light emitting layer and electrically connected to the power supply line through the auxiliary power supply pattern and an auxiliary pattern,
wherein the auxiliary power supply pattern is located between the first electrode and the power supply line in a thickness direction of the circuit element layer, wherein the first transistor comprises a first input electrode and a first output electrode,
wherein the first input electrode, the first output electrode, and the power supply line are disposed on a same layer, and
wherein the circuit element layer comprises:
a first intermediate insulating layer between the power supply line and the auxiliary power supply pattern; and
a second intermediate insulating layer between the auxiliary power supply pattern and the auxiliary pattern,
wherein the power supply line includes an overlap portion overlapped with the auxiliary power supply pattern, and
wherein at least a portion of the overlap portion is not overlapped with the auxiliary pattern.

2. The organic light emitting display apparatus of claim 1, further comprising an encapsulation layer on the display element layer, and a sealing member between the circuit element layer and the encapsulation layer and located in the non-display area to overlap with the auxiliary power supply pattern when viewed in a plan view,
wherein the auxiliary power supply pattern contacts the sealing member.

3. The organic light emitting display apparatus of claim 1, wherein the auxiliary pattern is directly connected to both the auxiliary power supply pattern and the second electrode.

4. The organic light emitting display apparatus of claim 1, wherein the first electrode and the auxiliary pattern are disposed on a same layer.

5. The organic light emitting display apparatus of claim 1, wherein the circuit element layer further comprises a data line on the base layer, and the data line and the power supply line are disposed on a same layer.

6. The organic light emitting display apparatus of claim 1, the display element layer further comprising a pixel definition layer between the auxiliary pattern and the second electrode, comprising a contact hole through which the auxiliary pattern is connected to the second electrode, and comprising an opening in which the light emitting layer is located.

7. The organic light emitting display apparatus of claim 1, wherein the circuit element layer further comprises:
a switching transistor comprising a control electrode to receive a scan signal, an input electrode receiving a data signal, and an output electrode;
a driving transistor comprising an input electrode connected to the output electrode of the switching transistor; and
a light emitting control transistor comprising a control electrode to receive a light emitting signal and being connected between a voltage line and the driving transistor or between the driving transistor and the first electrode.

8. The organic light emitting display apparatus of claim 7, wherein the circuit element layer further comprises:
a light emitting line driving circuit to apply the light emitting signal to the light emitting control transistor; and
a gate driving circuit to apply the scan signal to the switching transistor, the light emitting line driving circuit being farther from the display area than the gate driving circuit when viewed in a plan view.

9. The organic light emitting display apparatus of claim 8, wherein the auxiliary power supply pattern overlaps with the light emitting line driving circuit.

10. The organic light emitting display apparatus of claim 1, wherein the auxiliary power supply pattern comprises a material having a melting point higher than a melting point of the power supply line.

11. The organic light emitting display apparatus of claim 1, wherein the circuit element layer further comprises:
a voltage line to receive a source voltage having a higher voltage level than the common voltage; and
an auxiliary voltage pattern above the voltage line and connected to the voltage line.

12. The organic light emitting display apparatus of claim 11, further comprising a sealing member between the circuit element layer and an encapsulation layer and located in the non-display area to overlap with the auxiliary power supply pattern when viewed in a plan view,
wherein the auxiliary voltage pattern is on a same layer as the auxiliary power supply pattern and overlaps with the sealing member.

13. The organic light emitting display apparatus of claim 11, further comprising a sealing member between the circuit element layer and an encapsulation layer and located in the non-display area to overlap with the auxiliary power supply pattern when viewed in a plan view,
wherein the auxiliary voltage pattern contacts the sealing member.

14. The organic light emitting display apparatus of claim 11, wherein the circuit element layer further comprises a pad part in the non-display area, and the auxiliary voltage pattern is between the pad part and the display area when viewed in a plan view.

15. The organic light emitting display apparatus of claim 14, wherein the circuit element layer further comprises:
a demultiplexer connected between the pad part and a data line, and the auxiliary voltage pattern covers the demultiplexer when viewed in a plan view.

16. The organic light emitting display apparatus of claim 14, wherein the circuit element layer further comprises an anti-static pattern in the non-display area, and the auxiliary voltage pattern covers the anti-static pattern when viewed in a plan view.

17. The organic light emitting display apparatus of claim 1, further comprising a sealing member between the circuit element layer and an encapsulation layer and located in the non-display area to overlap with the auxiliary power supply pattern when viewed in a plan view,
wherein the auxiliary power supply pattern comprises a hole therethrough, and the sealing member contacts the first intermediate insulating layer, the second intermediate insulating layer, or the base layer through the hole.

18. The organic light emitting display apparatus of claim 1, wherein the auxiliary power supply pattern comprises an edge portion overlapped with the auxiliary pattern.

* * * * *